US012696415B2

(12) United States Patent
Tan et al.

(10) Patent No.: US 12,696,415 B2
(45) Date of Patent: Jul. 28, 2026

(54) BUFFER MODULE AND ELECTRONIC DEVICE

(71) Applicant: Wistron Corporation, New Taipei City (TW)

(72) Inventors: Siyun Tan, New Taipei City (TW); Yisheng Chen, New Taipei City (TW)

(73) Assignee: Wistron Corporation, New Taipei City (TW)

( * ) Notice: Subject to any disclaimer, the term of this patent is extended or adjusted under 35 U.S.C. 154(b) by 192 days.

(21) Appl. No.: 18/603,224

(22) Filed: Mar. 13, 2024

(65) Prior Publication Data

US 2025/0271915 A1     Aug. 28, 2025

(30) Foreign Application Priority Data

Feb. 23, 2024     (CN) .......................... 202410208709.4

(51) Int. Cl.
H05K 7/14          (2006.01)
(52) U.S. Cl.
CPC .................................. H05K 7/1487 (2013.01)

(58) Field of Classification Search
CPC .... H05K 7/1487; H05K 5/0221; H05K 5/023; G06F 1/187; A47B 2210/0094; A47B 88/473
See application file for complete search history.

(56) References Cited

U.S. PATENT DOCUMENTS 8,714,670 B2 *   5/2014   Kuo ....................... A47B 88/57
                                                          312/331

FOREIGN PATENT DOCUMENTS

CN            216984103          7/2022

* cited by examiner

*Primary Examiner* — James Wu
(74) *Attorney, Agent, or Firm* — JCIPRNET

(57) ABSTRACT

A buffer module including a main body, a driven component, and a sliding assembly is provided. The driven component is movably disposed on the main body and is used to move relatively to the main body. The sliding assembly is slidably disposed on the main body along a moving direction, where the sliding assembly is used to contact the driven component to suppress the movement of the driven component. In addition, an electronic device including the buffer module is also provided.

20 Claims, 15 Drawing Sheets

BUFFER MODULE AND ELECTRONIC DEVICE

CROSS-REFERENCE TO RELATED APPLICATION

This application claims the priority benefit of China application serial no. 202410208709.4, filed on Feb. 23, 2024. The entirety of the above-mentioned patent application is hereby incorporated by reference herein and made a part of this specification.

BACKGROUND

Technical Field

The disclosure relates a buffer module and an electronic device; more particularly, the disclosure relates to a buffer module that generates a buffering effect through acceleration and an electronic device including the buffer module.

Description of Related Art

A server module installed in a chassis of a plug-in server may be connected by plugging into a connector within the chassis. If a user inserts the server module into the chassis at an excessive speed, the connector inside the chassis and the corresponding connector of the server module may collide at high speed, potentially causing damage.

SUMMARY

The disclosure provides a buffer module and an electronic device that are capable of preventing damage to a connector due to an excessive plugging speed of an electronic assembly.

According to an embodiment of the disclosure, a buffer module including a main body, a driven component, and a sliding assembly is provided. The driven component is movably disposed on the main body and used to move relatively to the main body. The sliding assembly is slidably disposed on the main body, where the sliding assembly is used to contact the driven component, so as to suppress the movement of the driven component.

According to an embodiment of the disclosure, an electronic device including a device body, an electronic assembly, and a buffer module is provided. The electronic assembly is detachably installed on the device body. The buffer module is disposed on a surface of the electronic assembly and includes a main body, a driven component, and a sliding assembly. The driven component is movably disposed on the main body. The sliding assembly is slidably disposed on the main body, where the sliding assembly is used to contact the driven component, so as to suppress the movement of the driven component.

In an embodiment of the disclosure, the sliding assembly includes a sliding component and a counterweight component, the sliding component is slidably disposed on the main body, and the counterweight component is disposed on the sliding component.

In an embodiment of the disclosure, the sliding assembly further includes an elastic component, and the elastic component is connected between the counterweight component and the main body.

In an embodiment of the disclosure, the sliding assembly is equipped with a buffer portion, the buffer portion is adjacent to the driven component, and the buffer portion is used to contact the driven component to decelerate the movement of the driven component.

In an embodiment of the disclosure, the sliding assembly includes a sliding component and a connection rod, the sliding component is slidably disposed on the main body, the connection rod is movably connected to the main body and the sliding component, and the buffer portion is disposed at one end of the connection rod far from the sliding component.

In an embodiment of the disclosure, the connection rod has a first connection portion and a second connection portion, and the connection rod is connected to the sliding component through the first connection portion and is rotatably connected to the main body through the second connection portion.

In an embodiment of the disclosure, the sliding assembly is equipped with a stopper, the stopper is adjacent to the driven component, and the stopper is used to contact the driven component to stop the movement of the driven component.

In an embodiment of the disclosure, the sliding assembly includes a sliding component and a connection rod, the connection rod is movably connected to the main body and the sliding component, and the stopper is disposed at one end of the connection rod far from the sliding component.

In an embodiment of the disclosure, the driven component is a gear and is rotatably disposed on the main body.

In an embodiment of the disclosure, the electronic device further includes a rack that is disposed on the device body, the driven component is a gear and is rotatably disposed on the main body, and the gear is engaged with the rack.

In an embodiment of the disclosure, the electronic device further includes a deceleration module, where the electronic assembly is equipped with a leaning portion, and the electronic assembly is used to contact the deceleration module through the leaning portion to decelerate the electronic assembly.

In an embodiment of the disclosure, the deceleration module includes a contact component and an elastic component, the contact component is slidably disposed on the device body, the elastic component is connected between the contact component and the device body, and the leaning portion of the electronic assembly is used to push against the contact component.

According to an embodiment of the disclosure, a buffer module is disposed on an electronic assembly. The electronic assembly is used to move along a moving direction, and the buffer module includes a main body, a driven component, and a sliding assembly. The driven component is movably disposed on the main body and used to move relatively to the main body. The sliding assembly includes a sliding component that is slidably disposed on the main body and used to move relatively to the driven component in a direction opposite to the moving direction and contact the driven component, so as to suppress the movement of the driven component.

In view of the above, the buffer module, as provided in one or more embodiments of the disclosure, includes the sliding assembly that may generate displacement in response to the acceleration of the electronic assembly. When the sliding assembly generates displacement, the movement of the driven component is suppressed, consequently mitigating the motion of the electronic assembly and achieving a buffering effect. Thus, in light of the above-mentioned operation manner of the buffer module with a straightforward design and a compact structure, when a user forcefully inserts the electronic assembly into the device body by applying an excessive force, leading to excessive acceleration of the electronic assembly, the buffer module may decelerate or halt the movement of the electronic assembly through the buffering effect, thereby preventing damage to the connector due to the excessive plugging speed of the electronic assembly.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
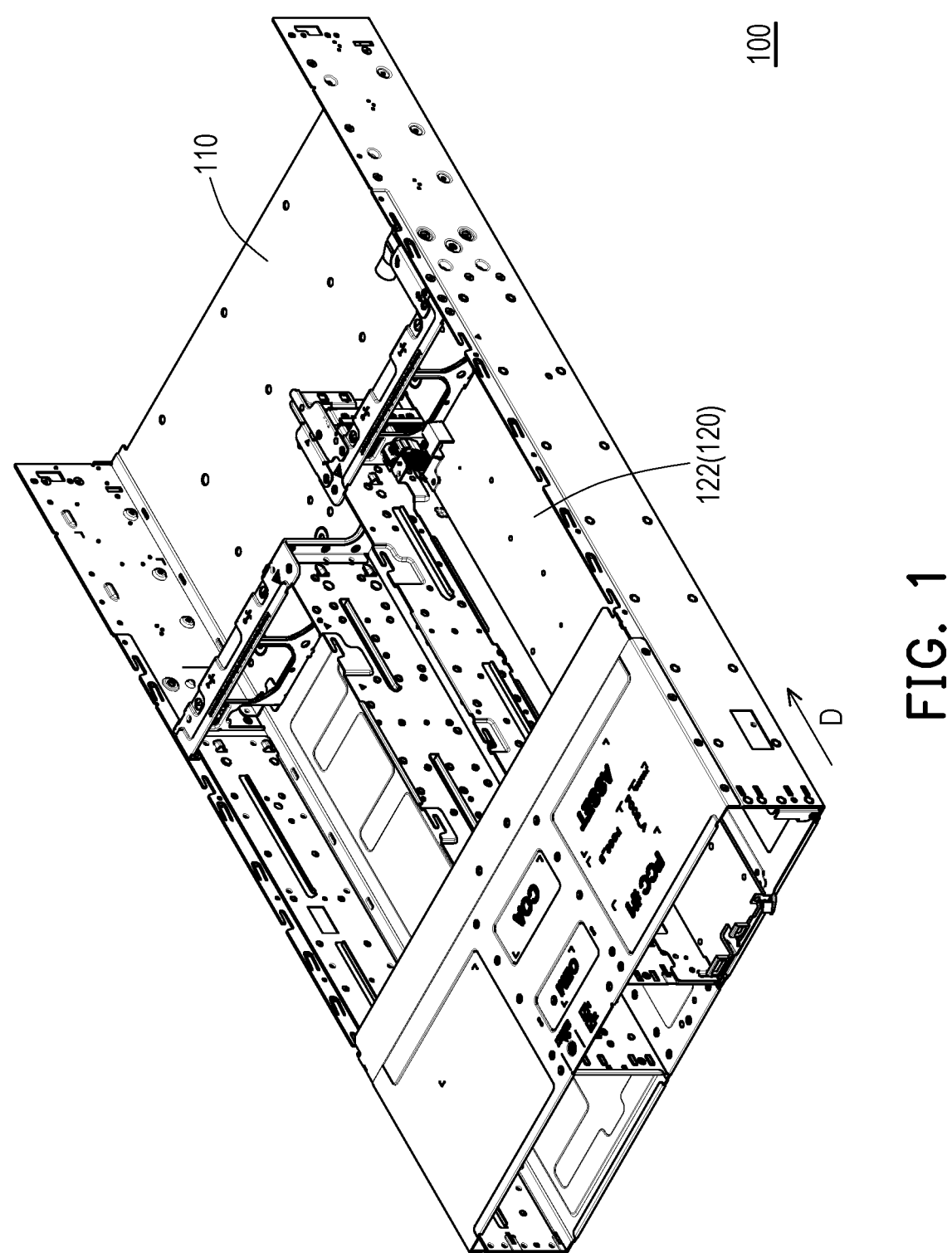
FIG. 1 is a three-dimensional view illustrating some components of an electronic device according to an embodiment of the disclosure.
Figure 2:
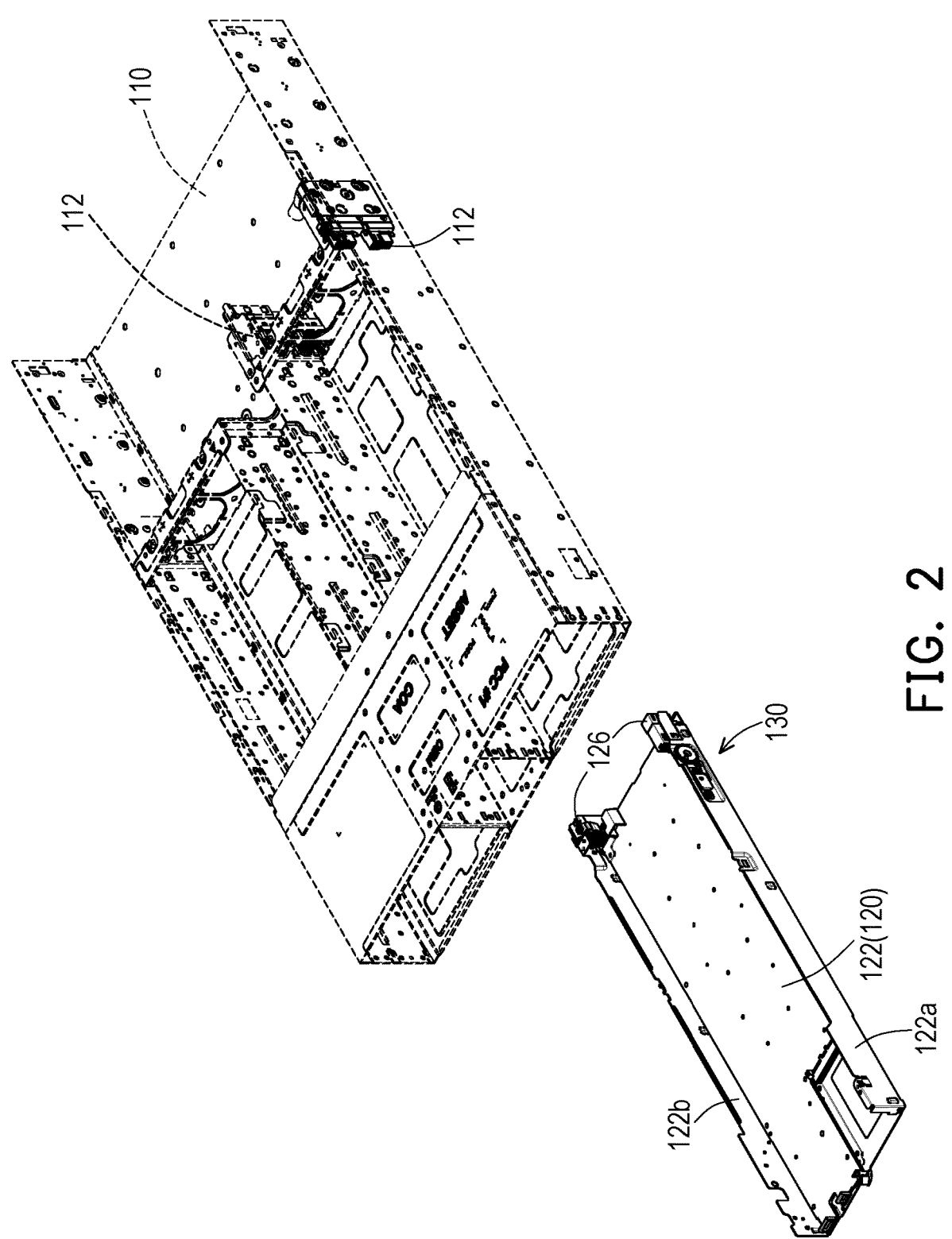
FIG. 2 illustrates the electronic assembly depicted in FIG. 1 is separated from the device body.
Figure 3:
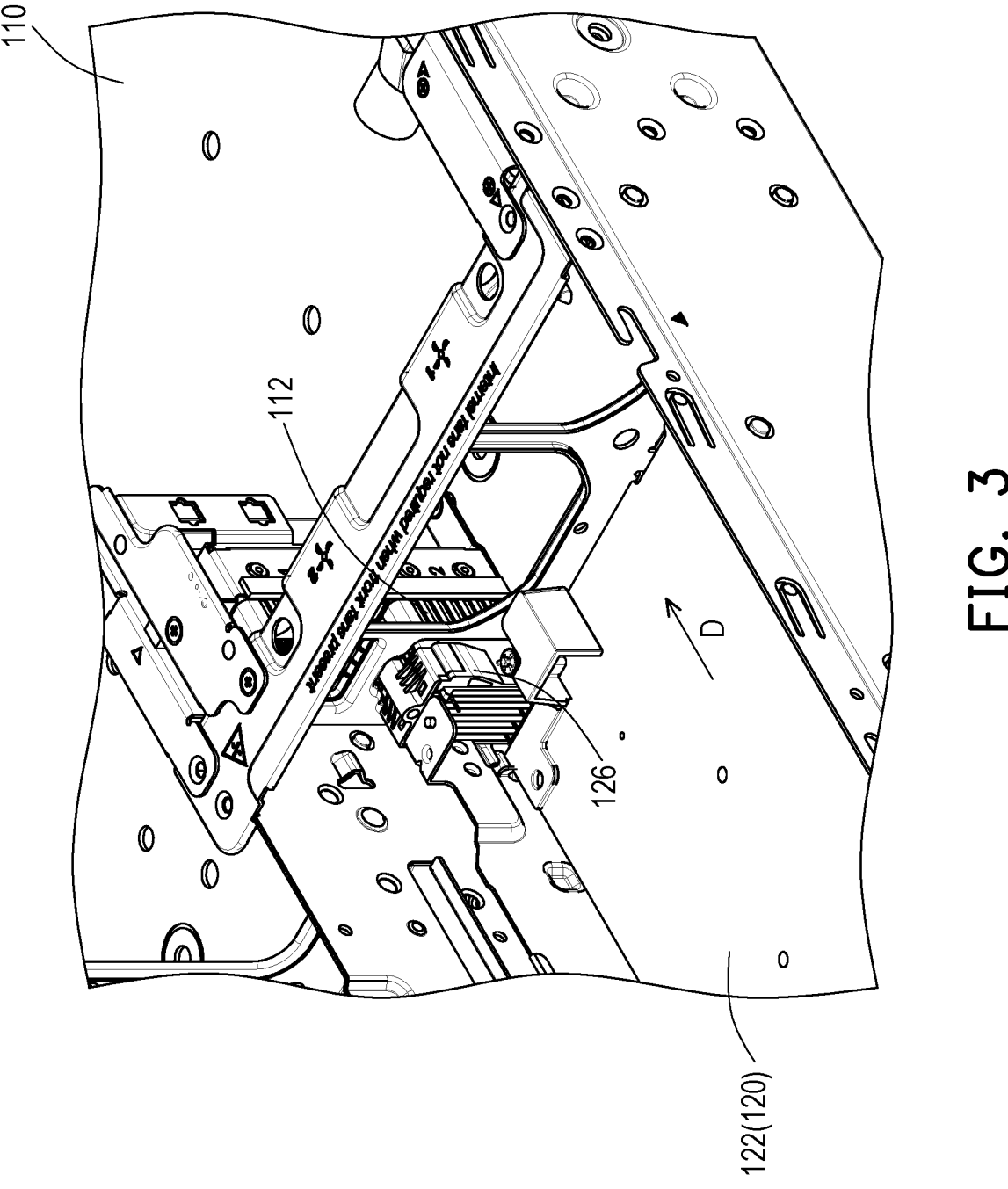
FIG. 3 is a partial enlarge view of the electronic device depicted in FIG. 1.

FIG. 1 is a three-dimensional view illustrating some components of an electronic device according to an embodiment of the disclosure. FIG. 2 illustrates the electronic assembly depicted in FIG. 1 is separated from the device body. FIG. 3 is a partial enlarge view of the electronic device depicted in FIG. 1. With reference to FIG. 1 to FIG. 3, an electronic device 100 provided in this embodiment is, for instance, a server and includes a device body 110 and at least one electronic assembly 120. The device body 110 is, for instance, a chassis and is equipped with a connector 112. The electronic assembly 120 is, for instance, a server module and includes a tray 122 and a circuit board module carried on the tray 122. For the sake of brief and concise illustration, the circuit board module is not shown in the drawings. The electronic assembly 120 is detachably installed on the device body 110, and the connector 126 of the electronic assembly 120 is used to be inserted into the connector 112 of the device body 110 along a moving direction D.

Figure 4:
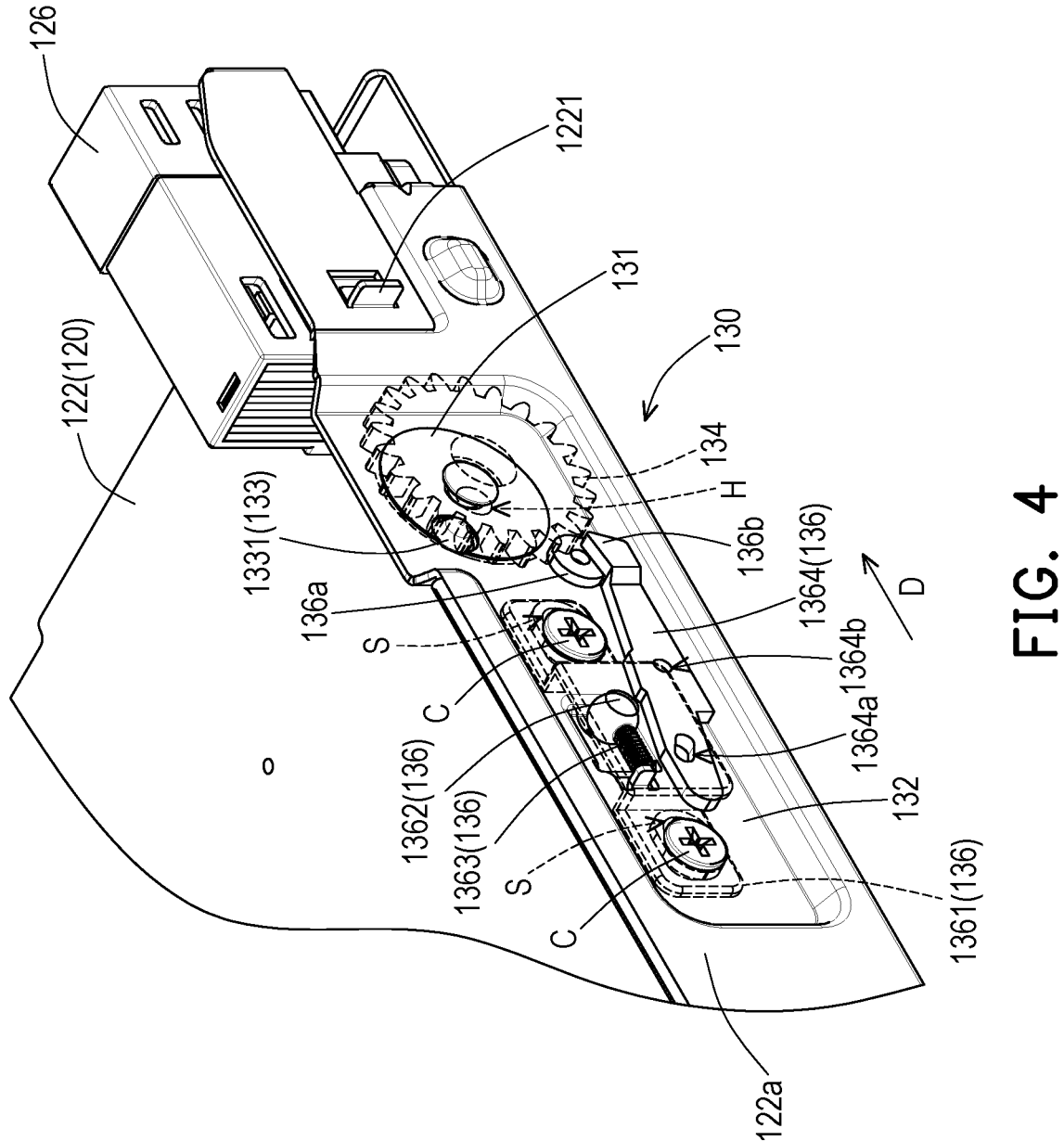
FIG. 4 is a partial enlarge view of the electronic assembly depicted in FIG. 2.
Figure 5:
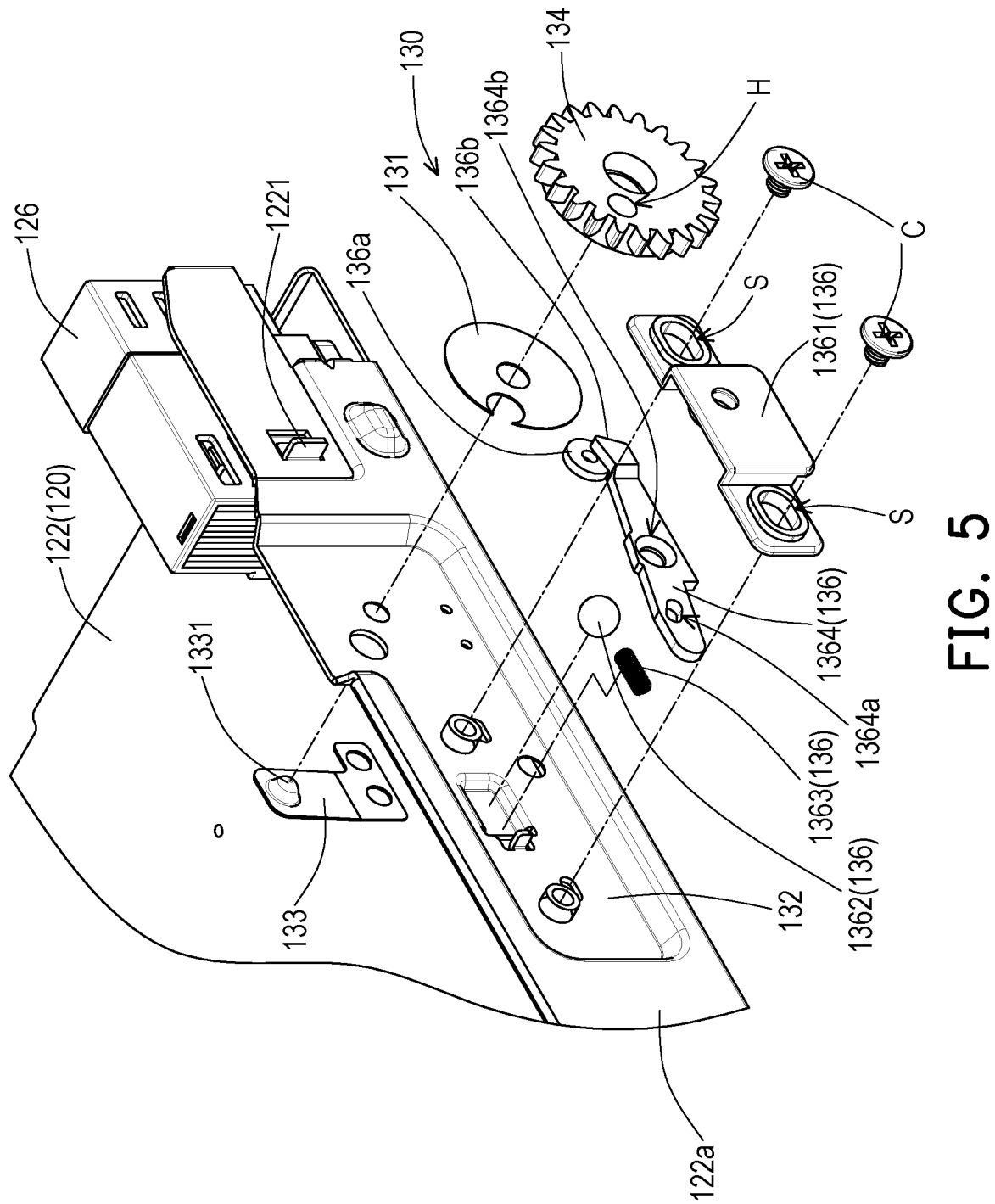
FIG. 5 is an exploded view of the buffer module depicted in FIG. 4.

FIG. 4 is a partial enlarge view of the electronic assembly depicted in FIG. 2. FIG. 5 is an exploded view of the buffer module depicted in FIG. 4. With reference to FIG. 4 and FIG. 5, the electronic device 100 provided in this embodiment further includes a buffer module 130. The buffer module 130 is disposed on a surface of the electronic assembly 120 and includes a main body 132, a driven component 134, and a sliding assembly 136. The main body 132 is, for instance, a partial structure of a sidewall 122a of the tray 122 of the electronic assembly 120. The driven component 134 is movably disposed on the main body 132 and is used to move relatively to the main body 132 as the main body 132 moves along the moving direction D. The sliding assembly 136 is slidably disposed on the main body 132 along the moving direction D. The sliding assembly 136 is used to move relatively to the main body 132 and the driven component 134 in a direction opposite to the moving direction D as the main body 132 accelerates along the moving direction D, so that the sliding assembly 136 generates displacement towards the driven component 134 and generates a frictional force through contacting the driven component 134 or is engaged with the driven component 134, thereby suppressing the movement of the driven component 134.

As mentioned above, the buffer module 130 provided in this embodiment includes the sliding assembly 136 that may generate displacement as the electronic assembly 120 accelerates. When the sliding assembly 136 generates displacement, the movement of the driven component 134 is suppressed, thereby mitigating the motion of the electronic assembly 120 and achieving a buffering effect. Accordingly, in light of the above-mentioned operation manner of the buffer module 130 with a straightforward design and a compact structure, when a user forcefully inserts the electronic assembly 120 into the device body 110 by applying an excessive force, leading to excessive acceleration of the electronic assembly 120, the buffer module 130 may decelerate or halt the movement of the electronic assembly 120 through the buffering effect, thereby preventing damage to the connectors 112 and 126 due to the excessive plugging speed of the electronic assembly 120.

Figure 6:
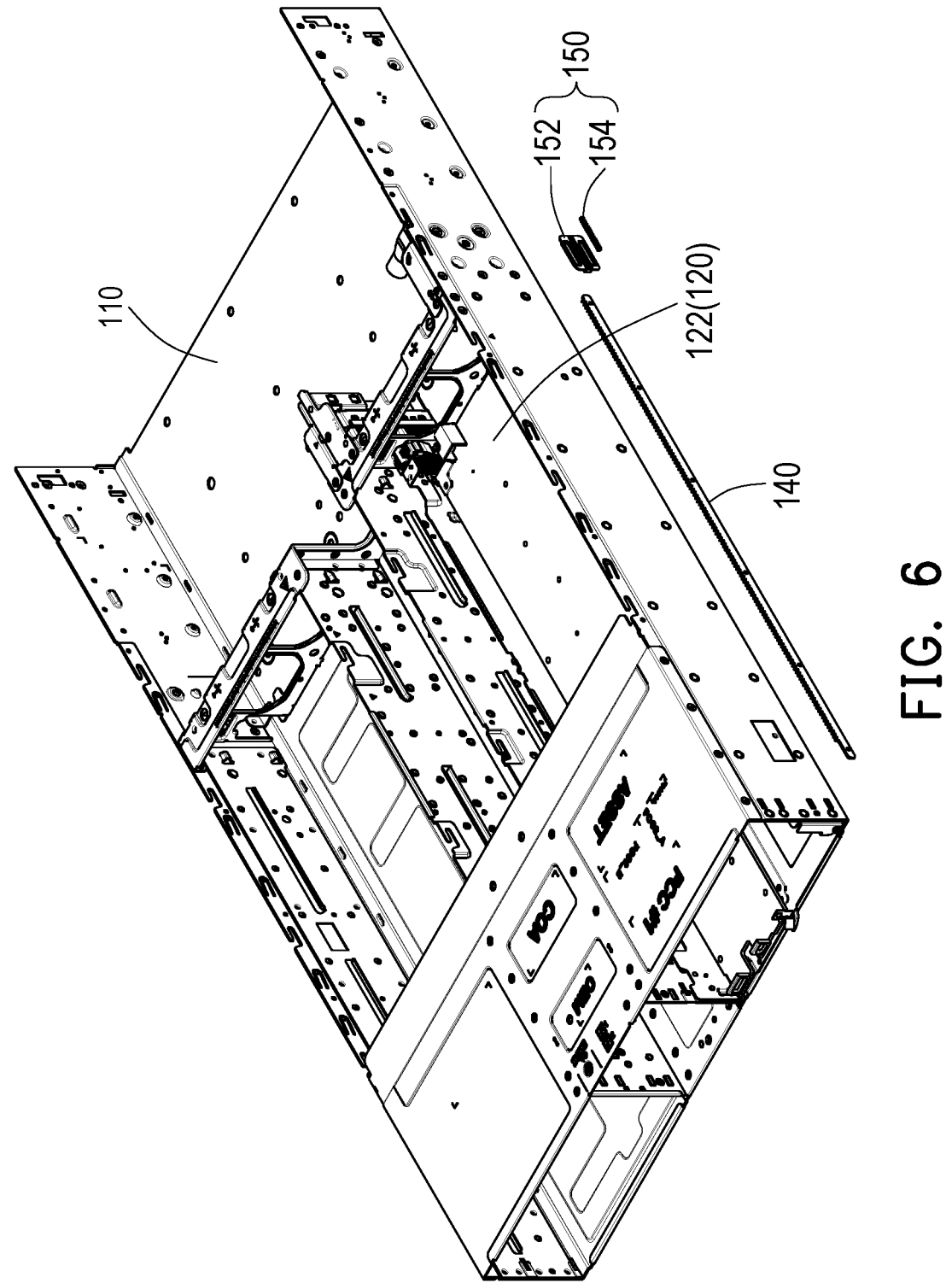
FIG. 6 is an exploded view of some components of the electronic device depicted in FIG. 1.
Figure 7A:
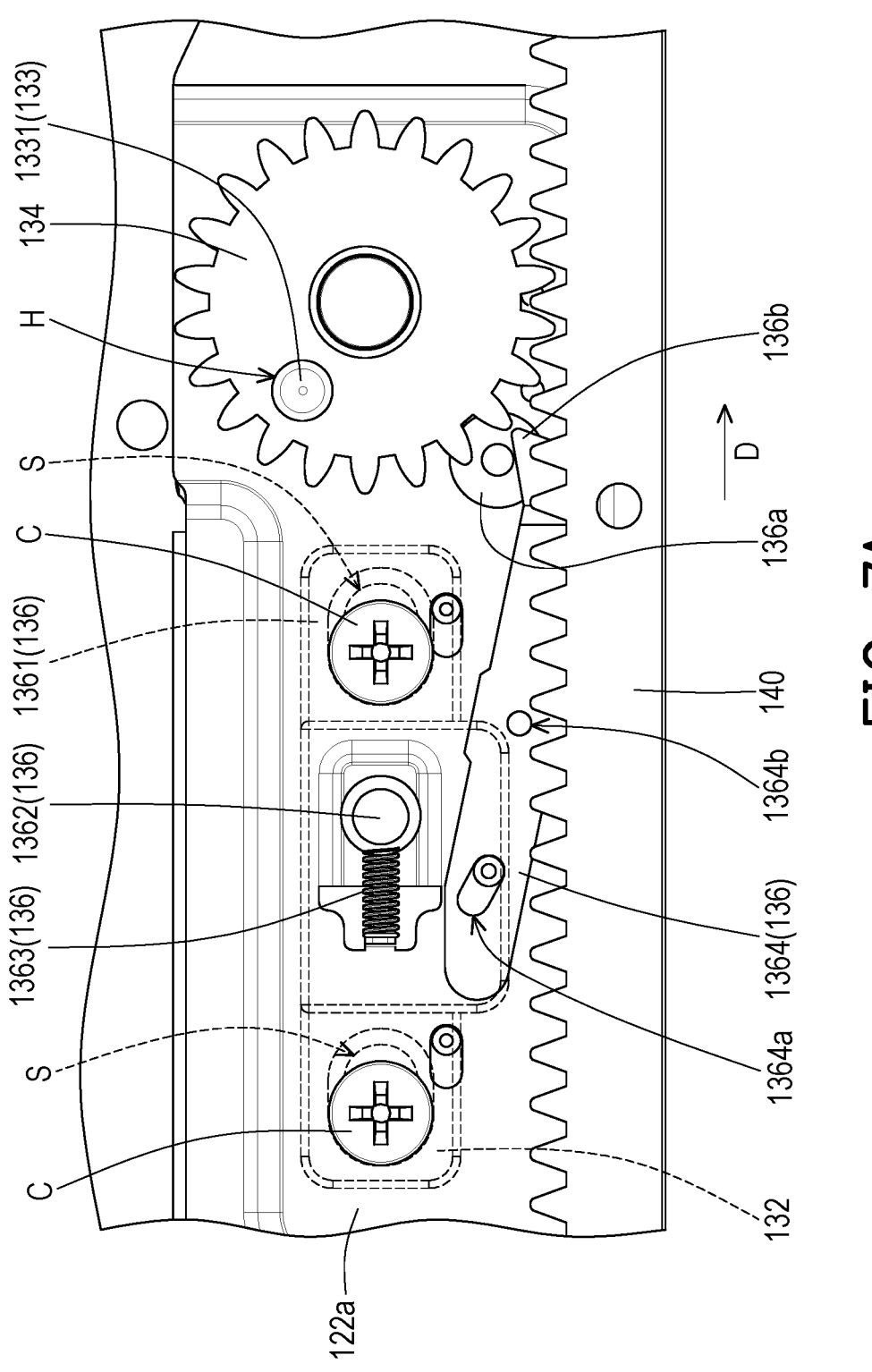
FIG. 7A to FIG. 7C illustrate a moving process of the buffer module depicted in FIG. 4.
Figure 7B:
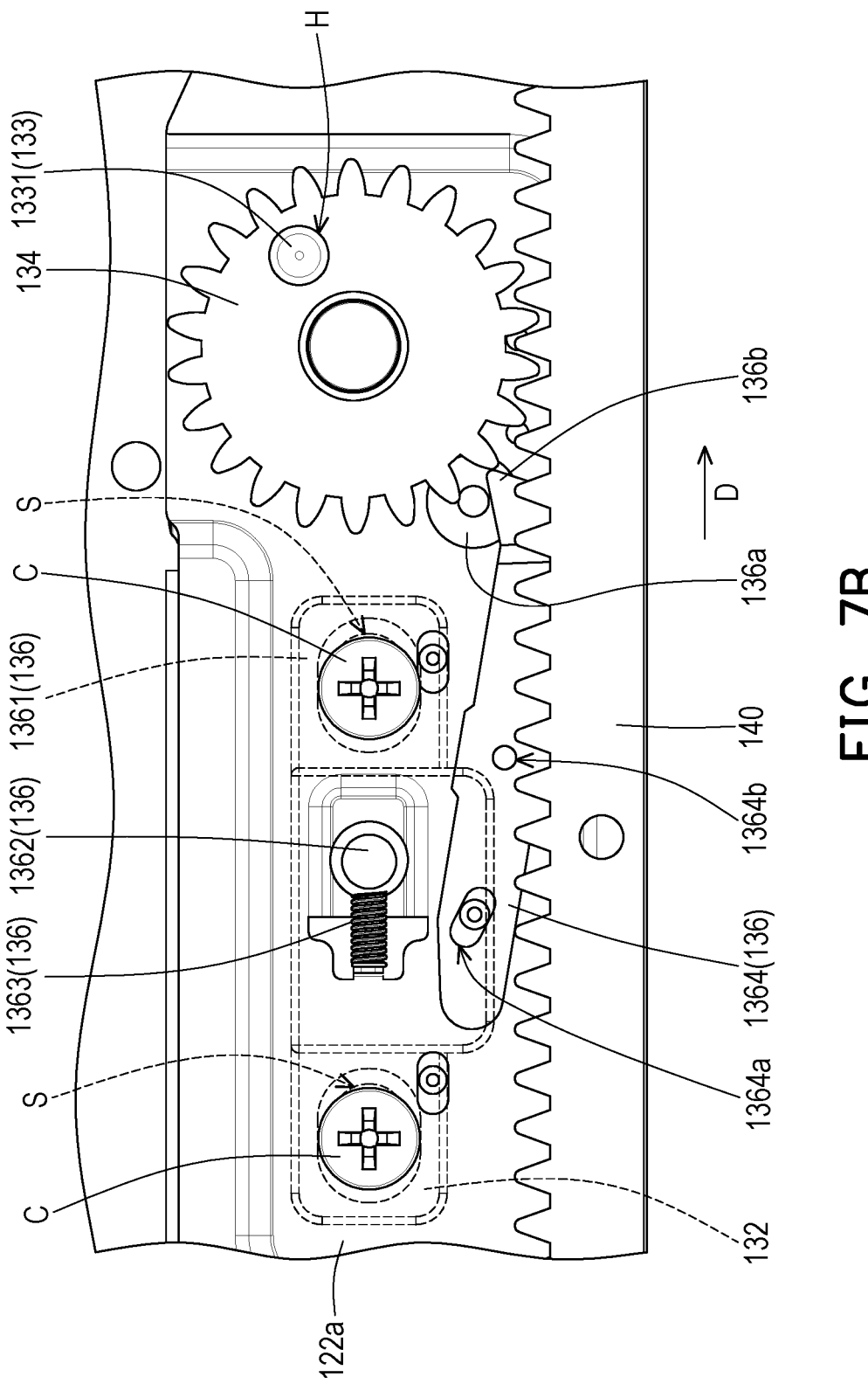
Figure 7C:
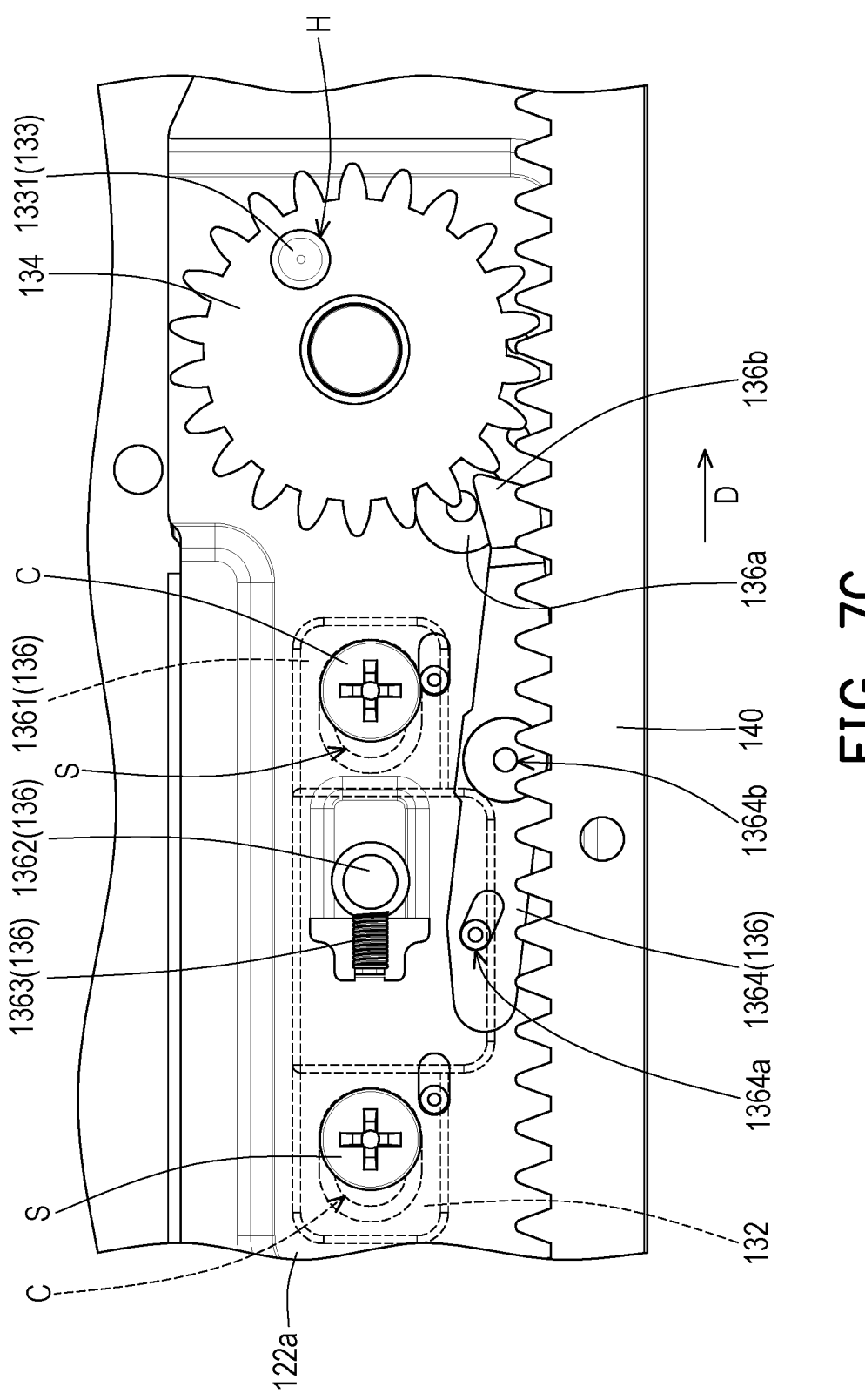

FIG. 6 is an exploded view of some components of the electronic device depicted in FIG. 1. FIG. 7A to FIG. 7C illustrate a moving process of the buffer module depicted in FIG. 4. With reference to FIG. 6 to FIG. 7C, specifically, the driven component 134 provided in this embodiment is, for instance, a gear and is rotatably disposed on the main body 132. Correspondingly, the electronic device 100 further includes a rack 140 fixedly arranged on the device body 110, and the gear (the driven component 134) is engaged with the rack 140 and is used to move along the rack 140 as the main body 132 moves along the moving direction D. Thereby, when the sliding assembly 136 suppresses the movement of the driven component 134 (the gear) as described above, the movement of the driven component 134 (the gear) along the rack 140 is decelerated or halted, thus decelerating or stopping the electronic assembly 120 due to the mutual engagement of the driven component 134 (the gear) and the rack 140. The buffering mechanism of the buffer module 130 provided in this embodiment is further elaborated below.

With reference to FIG. 4 and FIG. 5, the sliding assembly 136 provided in this embodiment includes a sliding component 1361, a counterweight component 1362, an elastic component 1363, and a connection rod 1364. The sliding component 1361 is slidably disposed on the main body 132 along the moving direction D through a cooperation of a sliding groove S of the sliding component 1361 with a column body C (e.g., a bolt) on the main body 132. The counterweight component 1362 is, for instance, a lead ball and fixedly arranged on the sliding component 1361. The elastic component 1363 is, for instance, a compression spring and connected between the counterweight component 1362 and the main body 132. The connection rod 1364 is movably connected to the main body 132 and the sliding component 1361. Specifically, the connection rod 1364 has a first connection portion 1364a and a second connection portion 1364b. The connection rod 1364 is connected to the sliding component 1361 through the first connection portion 1364a. The first connection portion 1364a is, for instance, a sliding groove and may cooperate with a protruding column 1361a of the sliding component 1361, thus allowing the sliding component 1364 to be slidably disposed between the connection rod 1364 and the main body 132. The second connection portion 1364b is, for instance, a pivot hole. The second connection portion 1364b is located between the first connection portion 1364b and the driven component 134. The sliding component 1364 is rotatably connected to the main body 132 through the second connection portion 1364b. In addition, the sliding assembly 136 has a buffer portion 136a and a stopper 136b on the connection rod 1364. The buffer portion 136a is, for instance, a rubber or any other elastic buffer material and disposed at one end of the connection rod 1364 far from the sliding component 1364, and the buffer portion 136a is adjacent to the driven component 134. The stopper 136b is located at the end of the connection rod 1364 far from the sliding component 1364 and adjacent to the driven component 134. The buffer portion 136a is disposed adjacent to the stopper 136b.

When the electronic assembly 120 has excessive acceleration in the moving direction D, the sliding component 1361 and the counterweight component 1362 resist the elastic force of the elastic component 1363 due to the inertia of the counterweight component 1362 and generate displacement relative to the main body 132 in the direction opposite to the moving direction D as shown in FIG. 7A to FIG. 7B or FIG. 7A to FIG. 7C. The protruding column 1361a of the sliding component 136 slides at the first connection portion 1364a of the connection rod 1364 and drives the second connection portion 1364b of the connection rod 1364 to pivotally rotate towards the driven component 134. When the sliding assembly 130 reaches a buffer position shown in FIG. 7B, the buffer portion 136a contacts the driven component 134 to decelerate the movement of the driven component 134. When the sliding assembly 130 reaches a stopper position shown in FIG. 7C, the stopper 136b stops the teeth of the driven component 134 (the gear) to halt the movement of the driven component 134. After the electronic assembly 120 is accordingly stopped, the user may slightly pull the electronic assembly 120 in the direction opposite to the moving direction D to release the engagement between the stopper 136b and the driven component 134, thereby allowing the sliding component 1361 and the counterweight component 1362 to be restored by the elastic force of the elastic component 1363, and the connection rod 1364 is accordingly restored. At this time, the user may continue to push the electronic assembly 120 along the moving direction D to plug the electronic assembly 120 into the device body 110.

Although the elastic force of the elastic component 1363 may cause the stopper 136b in the state shown in FIG. 7C to be disengaged from the driven component 134 due to the elastic force of the elastic component 1363 as long as the elastic force of the elastic component 1363 is sufficient, it should be mentioned that an excessive elastic force of the elastic component 1363 may lead to an insufficient movement of the counterweight component 1362 relative to the main body 132 by the inertial force. Therefore, in this embodiment, the elastic force of the elastic component 1363 is, for instance, less than an engagement force between the stopper 136b and the driven component 134, and it is necessary to disengage the stopper 136b from the driven component 134 by the force applied by the user as described above. In addition, by selecting the counterweight component 1362 with a specific mass, the counterweight component 1362 may generate a sufficient inertial force when the acceleration of the electronic component 120 exceeds a specific value, so as to resist the buffering effect generated by the elastic force of the elastic component 1363 and the frictional force between the structure. The specific values of the acceleration, the inertial force, the elastic force, the frictional force, and the like are common to people having ordinary skill in the pertinent art and may be calculated and implemented by the people, and thus no further explanation is provided herein, and the specific values should not be construed as limitations in the disclosure.

In this embodiment, the number of the buffer modules 130 may be two, and the two buffer modules 130 may be located on two opposite sides of the electronic component 120 in a direction perpendicular to the moving direction D. For instance, the two buffer modules 130 may be located on the opposite sidewalls 122a and 122b of the tray 122 of the electronic component 120 as shown in FIG. 2. Accordingly, the buffering force provided by the buffer module 130 may be more balanced.

With reference to FIG. 4 and FIG. 5, the buffer module 130 of this embodiment further includes a cushion pad 131 and a positioning elastic piece 133. The cushion pad 131 is, for instance, a Mylar sheet and is disposed on the main body 132 and used to contact the gear (the driven component 134), thus preventing an excessive frictional force between the gear (the driven component 134) and the main body 132 from hindering the rotation of the gear (the driven component 134). The positioning elastic piece 133 is disposed on the main body 132 and is used to fix an initial position of the gear (the driven component 134) through the cooperation of a protruding point 1331 of the positioning elastic piece 133 with a positioning hole H of the gear (the driven component 134).

Figure 8:
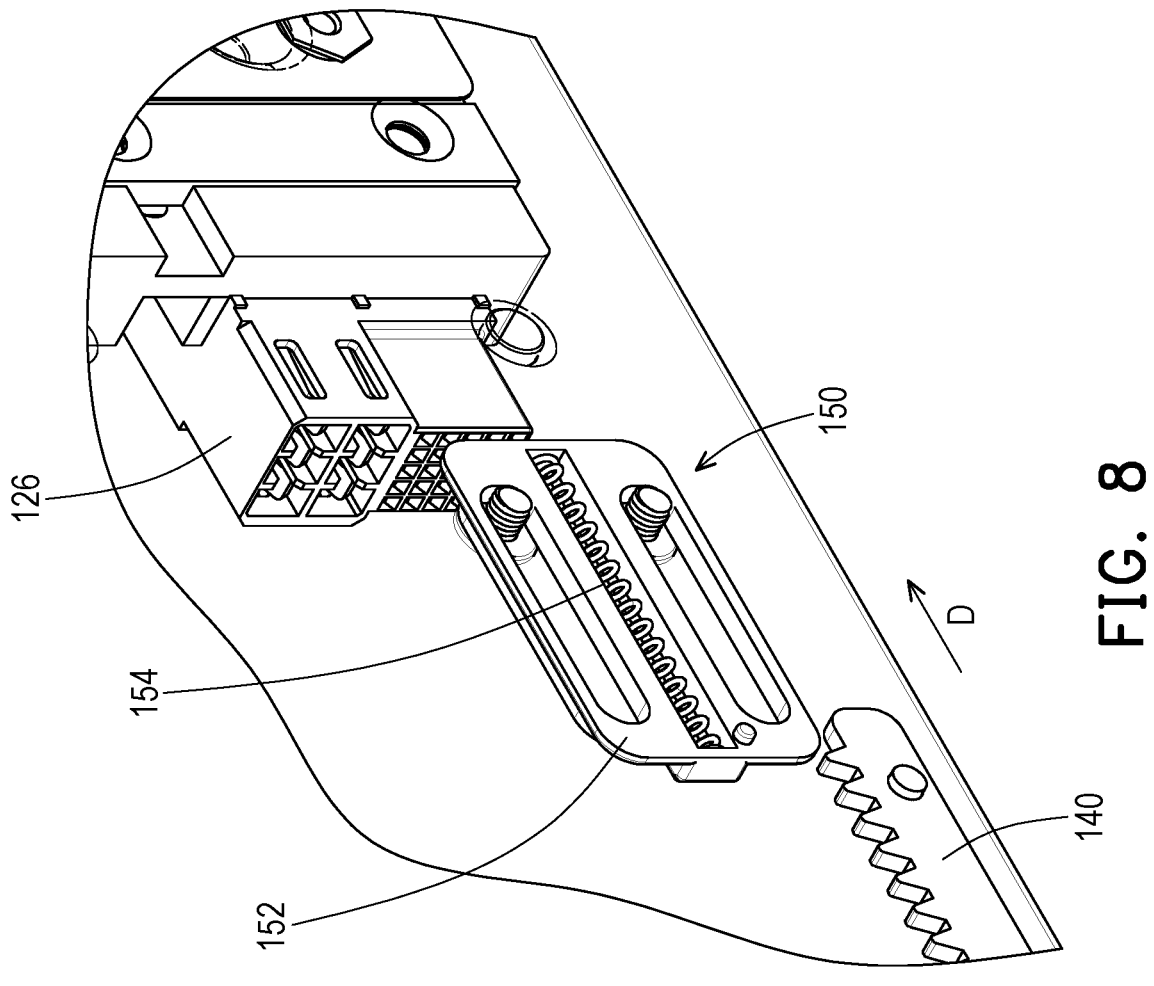
FIG. 8 is a partial three-dimensional view of the electronic device depicted in FIG. 1.

FIG. 8 is a partial three-dimensional view of the electronic device depicted in FIG. 1. With reference to FIG. 6 and FIG. 8, the electronic device 100 provided in this embodiment further includes a deceleration module 150 that is disposed on the device body 110 and located between the rack 140 and the connector 112 (indicated in FIG. 2) in the moving direction D. The electronic assembly 120 is used to contact the deceleration module 150 along the moving direction D and be decelerated by the deceleration module 150, so as to ensure that the speed at which the electronic assembly 120 is plugged into the device body 110 is not overspeed. Specifically, the deceleration module 150 provided in this embodiment includes a contact component 152 and an elastic component 154. The contact component 152 is slidably disposed on the device body 110 along the moving direction D, and the elastic component 154 is, for instance, a compression spring connected between the contact component 152 and the device body 110. As shown in FIG. 4, the tray 122 of the electronic assembly 120 is equipped with a leaning portion 1221, the leaning portion 1221 is adjacent to the connector 126, and the leaning portion 1221 is used to contact the contact component 152 of the deceleration module 150 to decelerate the electronic assembly 120.

Figure 9A:
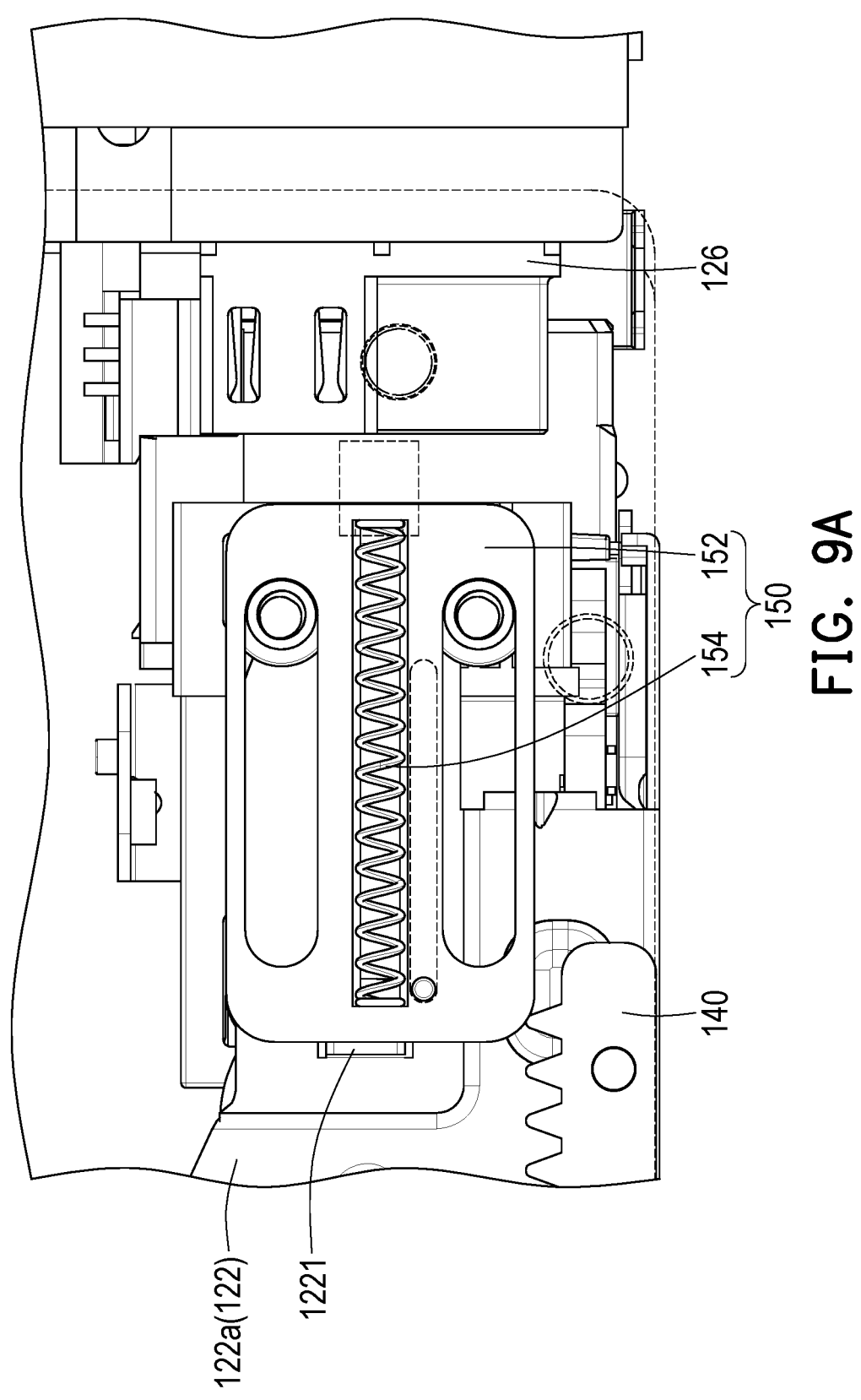
FIG. 9A and FIG. 9B illustrate an operation manner of the deceleration module depicted in FIG. 8.
Figure 9B:
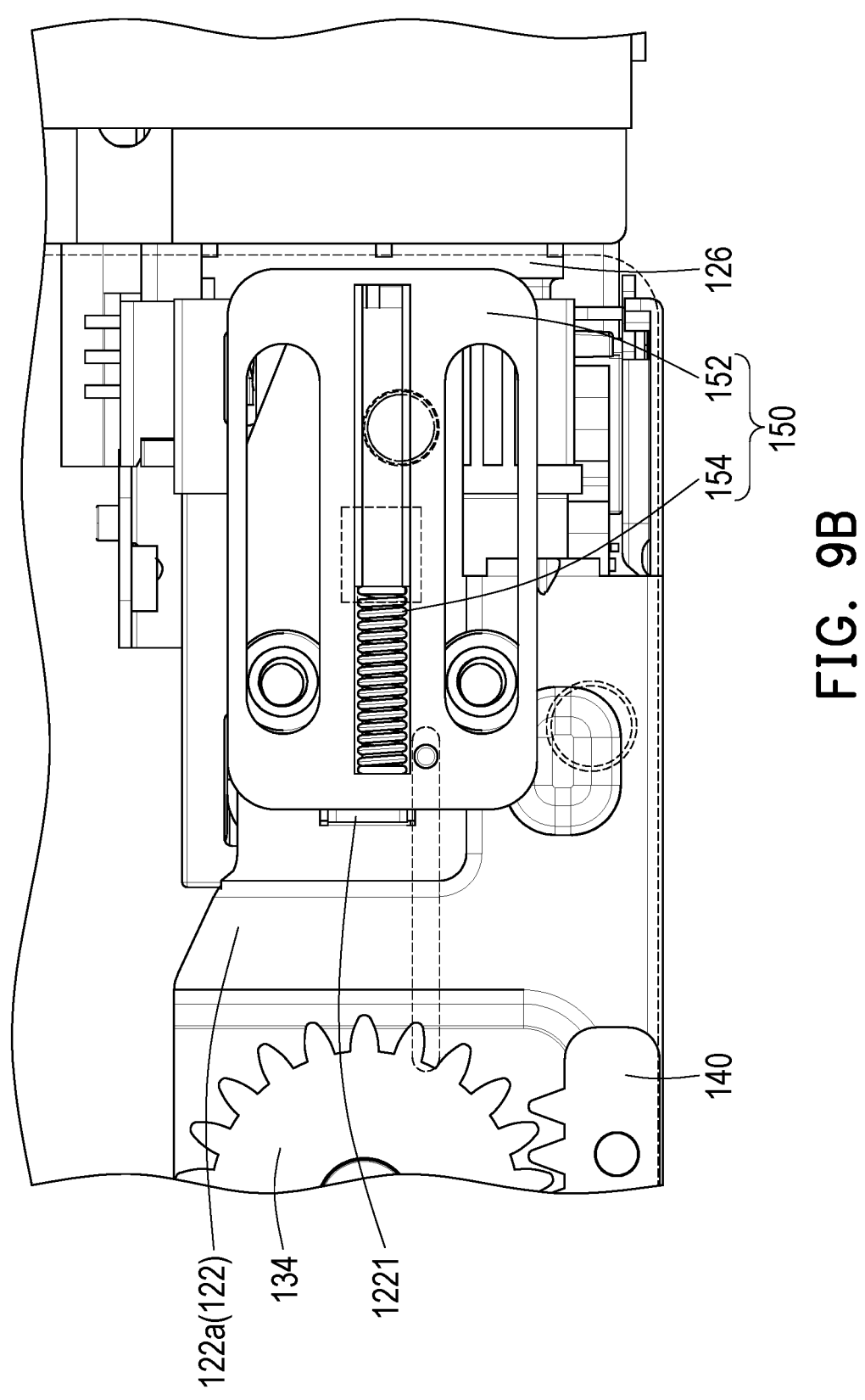

FIG. 9A and FIG. 9B illustrate an operation manner of the deceleration module depicted in FIG. 8. When the user pushes the electronic assembly 120 to a location close to the connector 112, the electronic assembly 120 pushes against the contact component 152 through the leaning portion 1221 as shown in FIG. 9A to FIG. 9B and resists the elastic force of the elastic component 154. During this process, the electronic assembly 120 is decelerated by the elastic force of the elastic component 154. After the electronic assembly 120 stops due to the deceleration effect, the user may push the electronic assembly 120 to the end along the moving direction D to plug the electronic assembly 120 into the device body 110. When the electronic assembly 120 moves away from the deceleration module 150 in the direction opposite to the moving direction D, the contact component 152 is restored from the location shown in FIG. 9B to the location shown in FIG. 9A due to the elastic force of the elastic component 154.

Figure 10:
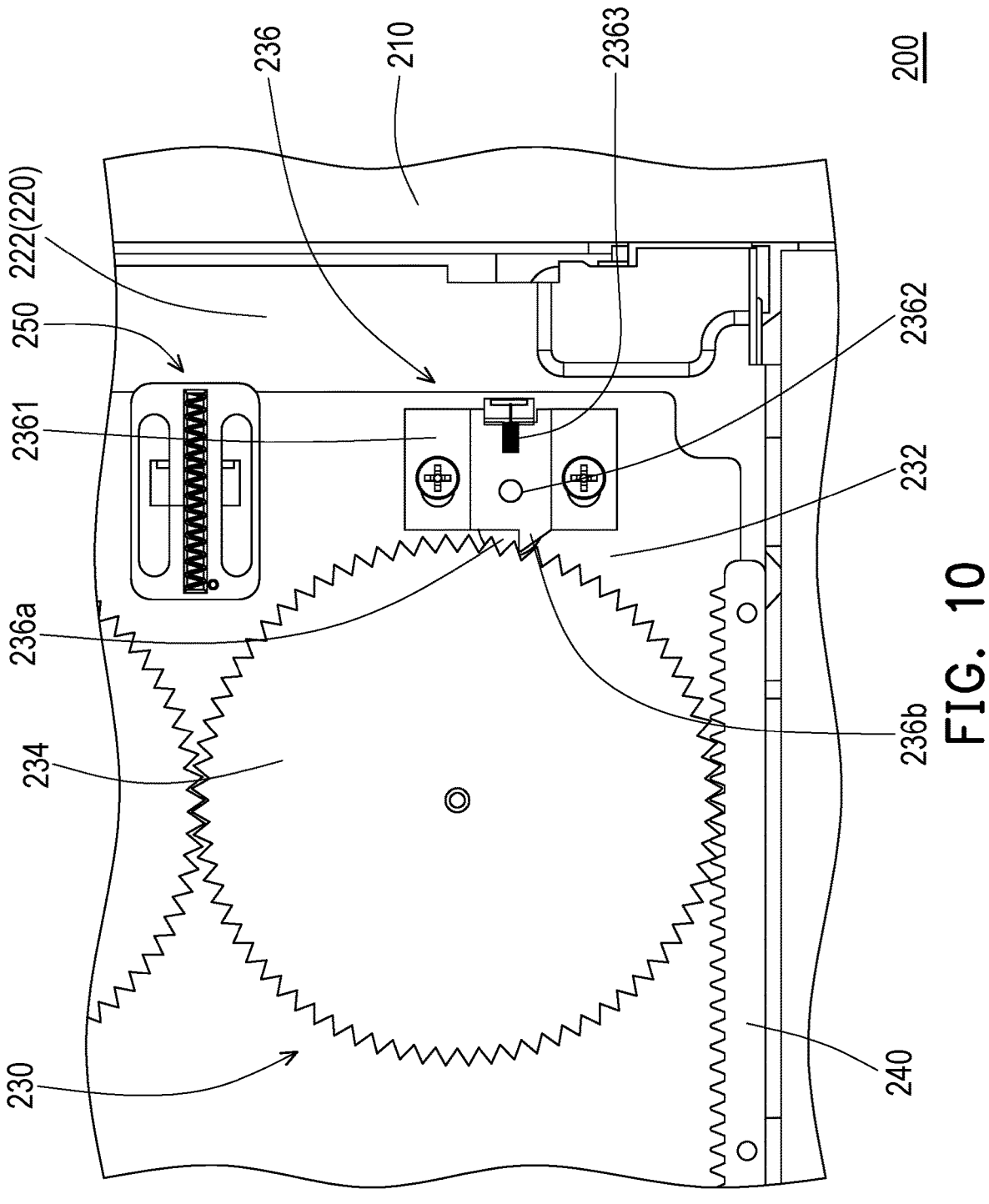
FIG. 10 is a partial bottom view of an electronic device according to another embodiment of the disclosure.
Figure 11A:
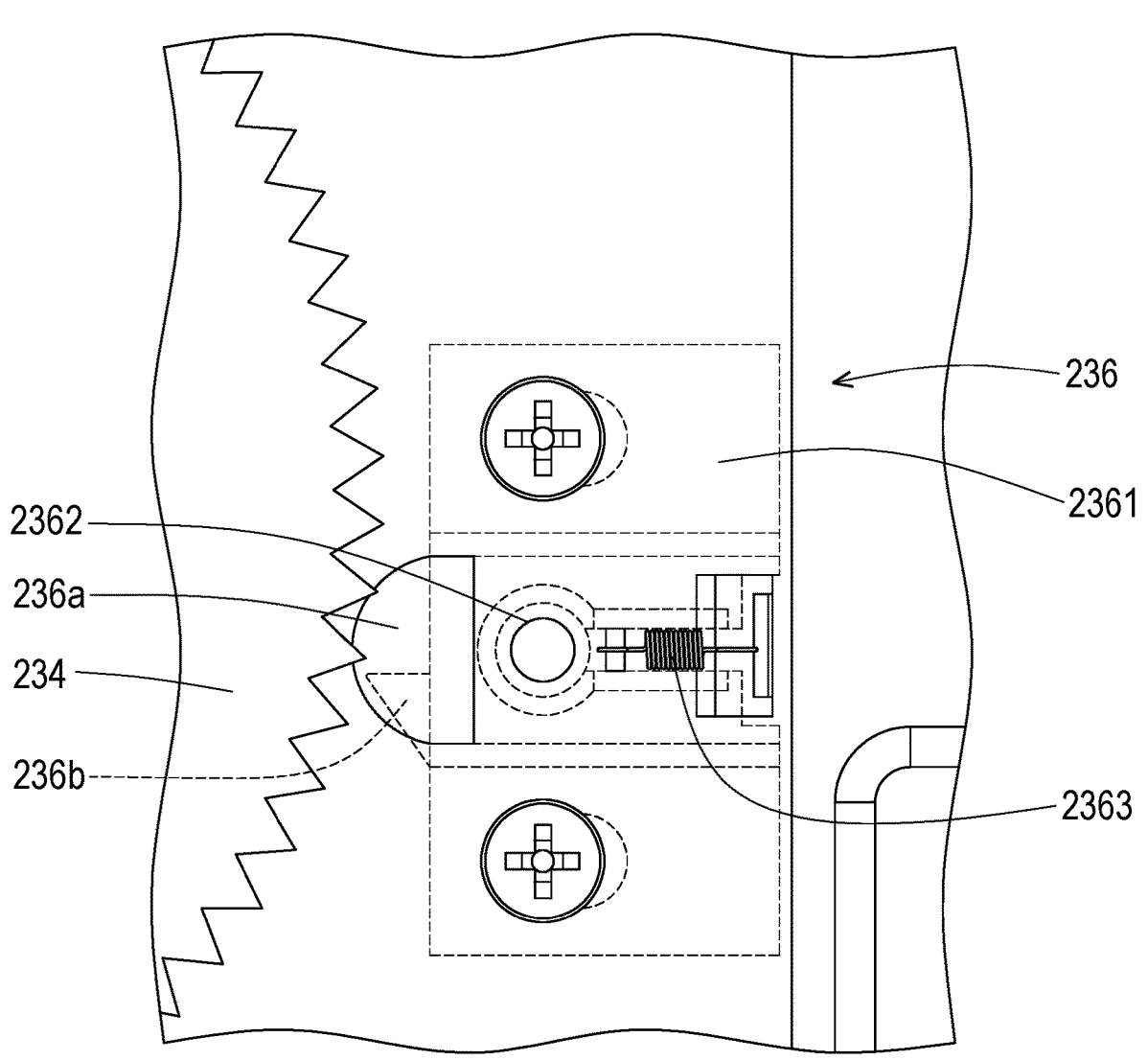
FIG. 11A and FIG. 11B illustrate an operation manner of the buffer module depicted in FIG. 10.
Figure 11B:
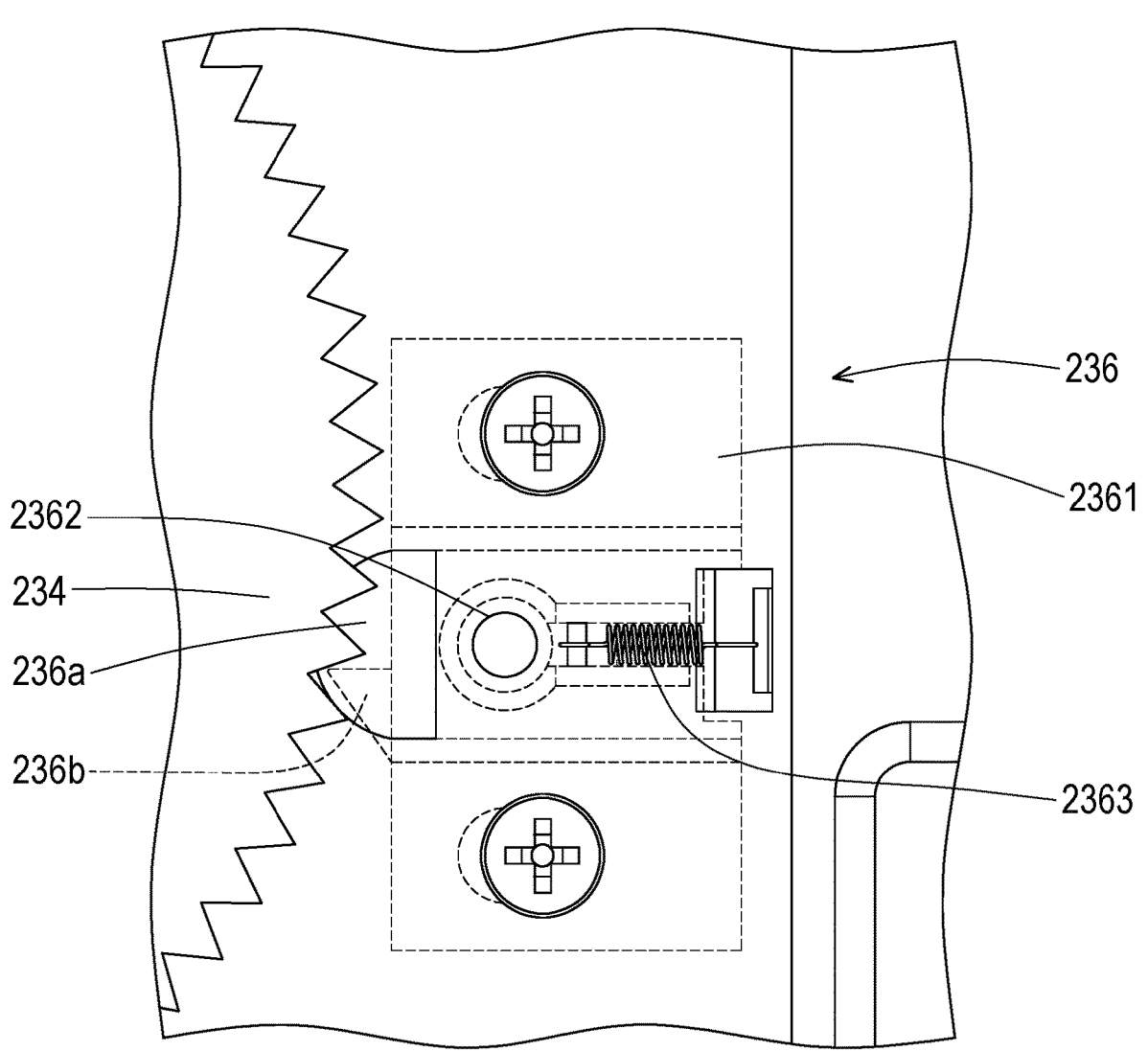

FIG. 10 is a partial bottom view of an electronic device according to another embodiment of the disclosure. FIG. 11A and FIG. 11B illustrate an operation manner of the buffer module depicted in FIG. 10. In an electronic device 200 shown in FIG. 10 to FIG. 11B, the arrangement and the operation manner of a device body 210, an electronic assembly 220, a buffer module 230, a main body 232, a driven component 234, a sliding assembly 236, a buffer portion 236*a*, a stopper 236*b*, a sliding component 2361, a counterweight component 2362, an elastic component 2363, a rack 240, and a deceleration module 250 are the same or similar to the arrangement and the operation manner of the device body 110, the electronic assembly 120, the buffer module 130, the main body 132, the driven component 134, the sliding assembly 136, the sliding component 1361, the counterweight component 1362, the elastic component 1363, the rack 140, and the deceleration module 150 provided in the previous embodiment and thus are not further elaborated hereinafter.

The main difference between the electronic device 200 and the electronic device 100 lies in that the buffer module 230, the rack 240, and the deceleration module 250 in the electronic device 200 are disposed on the underside of the electronic assembly 220 rather than on the left and right sides of the electronic assembly 220, thus preventing the difficulty in arranging the buffer module 230, the rack 240, and the deceleration module 250 due to the insufficient space between the left and right sides of the electronic assembly 220 and the device body 110. In addition, in the electronic device 200, the sliding assembly 236 does not include the connection rod 1364 provided in the previous embodiment, and the buffer portion 236*a* and the stopper 236*b* are directly disposed on one side of the sliding component 2361 and may, as shown in FIG. 11A to FIG. 11B, approach the driven component 234 through the movement of the sliding component 2361.

When the electronic assembly 220 has the excessive acceleration in the moving direction D, the sliding component 2361 and the counterweight component 2362 resist the elastic force of the elastic component 2363 through the inertia of the counterweight component 2362 and drive the sliding component 2361 to generate displacement relative to the main body 232 in the direction opposite to the moving direction D, as shown in FIG. 11A to FIG. 11B. The buffer portion 236*a* contacts the driven component 234 to decelerate the movement of the driven component 234. Accordingly, the electronic assembly 220 may be prevented from being plugged into the electronic device 200 at an excessively fast speed.

To sum up, the buffer module, as provided in one or more embodiments of the disclosure, includes the sliding assembly that may generate displacement in response to the acceleration of the electronic assembly. When the sliding assembly generates displacement, the movement of the driven component is suppressed, consequently mitigating the motion of the electronic assembly and achieving a buffering effect. Thus, in light of the above-mentioned operation manner of the buffer module with a straightforward design and a compact structure, when a user forcefully inserts the electronic assembly into the device body by applying an excessive force, leading to excessive acceleration of the electronic assembly, the buffer module may decelerate or halt the movement of the electronic assembly through the buffering effect, thereby preventing damage to the connector due to the excessive plugging speed of the electronic assembly.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A buffer module, comprising:
   a main body;
   a driven component, movably disposed on the main body and moved relatively to the main body; and
   a sliding assembly, slidably disposed on the main body, wherein the sliding assembly is used to contact the driven component, so as to suppress the movement of the driven component,
   wherein the sliding assembly is configured to move relatively to the main body and the driven component in a direction opposite to a moving direction as the main body accelerates along the moving direction.

2. The buffer module according to claim 1, wherein the sliding assembly comprises a sliding component and a counterweight component, the sliding component is slidably disposed on the main body, and the counterweight component is disposed on the sliding component.

3. The buffer module according to claim 2, wherein the sliding assembly further comprises an elastic component, and the elastic component is connected between the counterweight component and the main body.

4. The buffer module according to claim 1, wherein the sliding assembly is equipped with a buffer portion, the buffer portion is adjacent to the driven component, and the buffer portion is used to contact the driven component to decelerate the movement of the driven component.

5. The buffer module according to claim 4, wherein the sliding assembly comprises a sliding component and a connection rod, the sliding component is slidably disposed on the main body, the connection rod is movably connected to the main body and the sliding component, and the buffer portion is disposed at one end of the connection rod away from the sliding component.

6. The buffer module according to claim 5, wherein the connection rod has a first connection portion and a second connection portion, and the connection rod is connected to the sliding component through the first connection portion and is rotatably connected to the main body through the second connection portion.

7. The buffer module according to claim 1, wherein the sliding assembly is equipped with a stopper, the stopper is adjacent to the driven component, and the stopper is used to contact the driven component to stop the movement of the driven component.

8. The buffer module according to claim 7, wherein the sliding assembly comprises a sliding component and a connection rod, the connection rod is movably connected to the main body and the sliding component, and the stopper is disposed at one end of the connection rod far from the sliding component.

9. The buffer module according to claim 1, wherein the driven component is a gear and is rotatably disposed on the main body.

10. An electronic device, comprising:
   a device body;
   an electronic assembly, detachably installed on the device body; and
   a buffer module, disposed on a surface of the electronic assembly and comprising:
      a main body;
      a driven component, movably disposed on the main body; and
      a sliding assembly, slidably disposed on the main body, wherein the sliding assembly is used to contact the driven component, so as to suppress the movement of the driven component,
      wherein the sliding assembly is configured to move relatively to the main body and the driven component in a direction opposite to a moving direction as the main body accelerates along the moving direction.

11. The electronic device according to claim 10, wherein the sliding assembly comprises a sliding component and a counterweight component, the sliding component is slidably disposed at the main body, and the counterweight component is disposed at the sliding component.

12. The electronic device according to claim 11, wherein the sliding assembly further comprises an elastic component, and the elastic component is connected between the counterweight component and the main body.

13. The electronic device according to claim 10, wherein the sliding assembly is equipped with a buffer portion, the buffer portion is adjacent to the driven component, and the buffer portion is used to contact the driven component to decelerate the movement of the driven component.

14. The electronic device according to claim 13, wherein the sliding assembly comprises a sliding component and a connection rod, the sliding component is slidably disposed on the main body, the connection rod is movably connected to the main body and the sliding component, and the buffer portion is disposed at one end of the connection rod away from the sliding component.

15. The electronic device according to claim 10, wherein the sliding assembly is equipped with a stopper, the stopper is adjacent to the driven component, and the stopper is used to contact the driven component to stop the movement of the driven component.

16. The electronic device according to claim 15, wherein the sliding assembly comprises a sliding component and a connection rod, the sliding component is slidably disposed on the main body, the connection rod is movably connected to the main body and the sliding component, and the stopper is disposed at one end of the connection rod far from the sliding component.

17. The electronic device according to claim 10, further comprising a rack, wherein the rack is disposed on the device body, the driven component is a gear and is rotatably disposed on the main body, and the gear is engaged with the rack.

18. The electronic device according to claim 10, further comprising a deceleration module, wherein the electronic assembly is equipped with a leaning portion, and the electronic assembly is used to contact the deceleration module through the leaning portion to decelerate the electronic assembly.

19. The electronic device according to claim 18, wherein the deceleration module comprises a contact component and an elastic component, the contact component is slidably disposed on the device body, the elastic component is connected between the contact component and the device body, and the leaning portion of the electronic assembly is used to push against the contact component.

20. A buffer module, disposed on an electronic assembly, the electronic assembly being used to move along a moving direction, the buffer module comprising:
   a main body;
   a driven component, movably disposed on the main body and used to move relatively to the main body; and
   a sliding assembly, comprising:
      a sliding component, slidably disposed on the main body and used to move relatively to the driven component in a direction opposite to the moving direction and contact the driven component, so as to suppress the movement of the driven component,
      wherein the sliding assembly is configured to move relatively to the main body and the driven component in the direction opposite to the moving direction as the main body accelerates along the moving direction.

* * * * *